United States Patent [19]

Gale et al.

[11] Patent Number: 5,605,489
[45] Date of Patent: Feb. 25, 1997

[54] METHOD OF PROTECTING MICROMECHANICAL DEVICES DURING WAFER SEPARATION

[75] Inventors: Richard O. Gale, Richardson; Michael A. Mignardi, Dallas, both of Tex.

[73] Assignee: Texas Instruments Incorporated, Dallas, Tex.

[21] Appl. No.: 448,205

[22] Filed: May 23, 1995

Related U.S. Application Data

[62] Division of Ser. No. 82,183, Jun. 24, 1993, Pat. No. 5,445,559.

[51] Int. Cl.$^6$ ........................................... B24B 41/06
[52] U.S. Cl. .................. 451/28; 451/41; 451/54; 451/57; 451/388; 269/21; 437/226; 148/DIG. 28
[58] Field of Search ........................... 451/28, 31, 41, 451/54, 57, 63, 388, 285, 287, 288; 269/21; 437/226; 148/DIG. 28

[56] References Cited

U.S. PATENT DOCUMENTS

| | | | |
|---|---|---|---|
| 3,809,050 | 5/1974 | Chough et al. | 125/35 |
| 3,811,182 | 5/1974 | Ryan, Sr. et al. | 29/574 |
| 3,971,170 | 7/1976 | Coburn et al. | 451/388 |
| 3,976,288 | 8/1976 | Cuomo, Jr. | 269/21 |
| 3,994,101 | 11/1976 | Coburn et al. | 451/388 |
| 4,138,304 | 2/1979 | Gantley | 156/268 |
| 4,184,292 | 1/1980 | Defazio et al. | 451/388 |
| 4,213,698 | 7/1980 | Firtion et al. | 451/388 |
| 4,669,226 | 6/1987 | Mandler | 451/388 |
| 5,029,418 | 7/1991 | Bull | 451/388 |
| 5,291,692 | 3/1994 | Takahashi et al. | 451/388 |
| 5,314,844 | 5/1994 | Imamura | 437/226 |
| 5,415,581 | 5/1995 | Bando | 451/67 |
| 5,527,744 | 6/1996 | Mignardi et al. | 437/226 |

OTHER PUBLICATIONS

Pelletier, *Vacuum Handler for Diced Wafers*, IBM Technical Disclosure Bulletin, vol. 24, No. 7A, Dec. 1981, p. 3484.

*Primary Examiner*—Willis Little
*Assistant Examiner*—Eileen P. Morgan
*Attorney, Agent, or Firm*—Charles A. Brill; James C. Kesterson; Richard L. Donaldson

[57] ABSTRACT

A processing fixture and method of fabricating micromechanical devices, such as digital micromirror devices, that allows fragile structures on wafer 22 to be protected from debris during the saw operation and subsequent cleaning operations. The wafer 22 is attached to a vacuum fixture 26 after partially sawing the wafer 22 to create saw kerfs. The backside of the wafer 22 is then ground down to the saw kerfs 24 to separate the devices 32. Each device 32 is held on the fixture by a vacuum in the headspace above the device 32. In an alternate embodiment the devices are separated by sawing completely through the wafer while in the fixture.

10 Claims, 2 Drawing Sheets

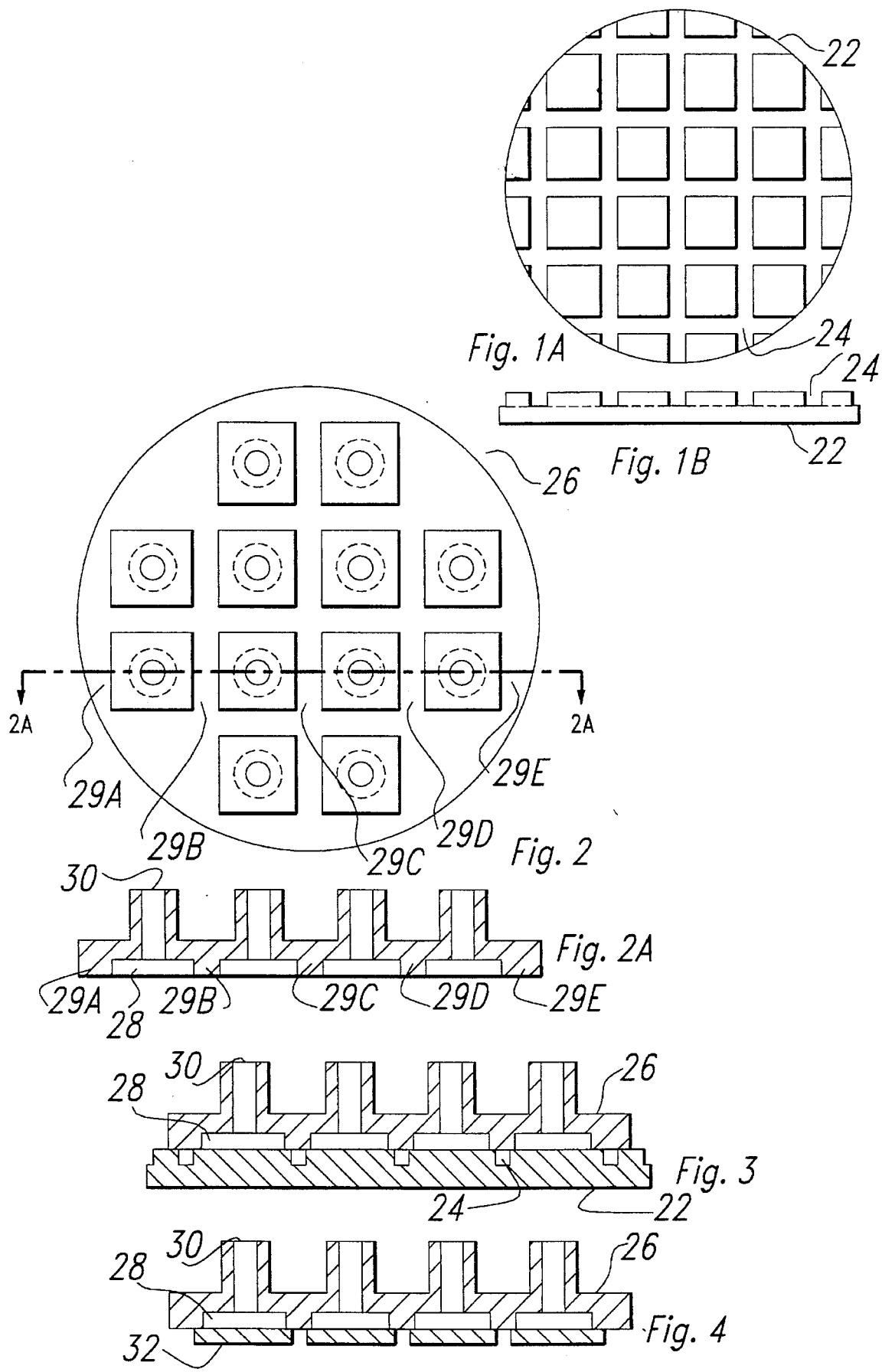

METHOD OF PROTECTING MICROMECHANICAL DEVICES DURING WAFER SEPARATION

This is a divisional of application Ser. No. 08/082,183, filed Jun. 24, 1993, now U.S. Pat. No. 5,445,559.

FIELD OF THE INVENTION

This invention relates to the field of integrated circuit processing, more particularly to micromechanical device fabrication, including deformable micromirror devices.

BACKGROUND OF THE INVENTION

In order for integrated circuit (IC) processing to be cost effective, the individual circuits, or chips, should be mass produced by using a semiconductor wafer to make many chips on a single substrate simultaneously. Typical processing for microelectronic mechanical systems (MEMS) involves extensive chip handling during processes such as the sacrificial layer removal and device testing. The ability to perform these processes in wafer form as opposed to chip form is very attractive. Carrying out the processing at the wafer level reduces the handling necessary because processing equipment must only move and align one wafer instead of many chips. Alignment, or registration, is very critical for die testing. After all wafer level processing has been done, the chips are separated and packaged. When the devices are separated from a wafer, wafer particles and dust, also known as dicing debris, is created. This dicing debris is then typically washed from the surface of the IC prior to bonding the chip to the package.

Micromechanical devices often have structures that are too fragile to survive exposure to some of the standard IC fabrication steps. An example is the digital micromirror device (DMD). DMDs are explained in U.S. Pat. No. 5,061,049 "Spatial Light Modulator and Method" which is assigned to Texas Instruments Incorporated. As described in the aforementioned patent, DMDs have a very small mirror suspended over an air gap above electrodes formed on the surface of a silicon substrate. Once this mirror is formed and the sacrificial material etched from the air gap, the DMD is very fragile. The devices cannot be exposed to liquids, for example during wafer cleanup steps, without destroying the mirror. Therefore, the devices must be cut and the dicing debris washed away before etching the sacrificial layer away from the mirror. This requires that the cleaning and etching steps, and any following steps, including testing be performed on the individual chips instead of a wafer.

SUMMARY OF THE INVENTION

In accordance with the present invention, a protective fixture has been constructed to allow efficient wafer processing of micromechanical devices. This fixture can be held against a water containing micromechanical devices by drawing a vacuum on the headspaces enclosed between the fixture and the wafer. The fixture is constructed with surfaces that allow the fixture and water to form a seal around each device. The devices on the wafer are then separated and any debris created during the separation process is washed off of the devices and the fixture. It is an advantage of this invention to provide a fixture and method that allow a wafer containing micromechanical devices to be completely fabricated using industry standard techniques.

BRIEF DESCRIPTION OF THE DRAWINGS

FIGS. 1A and 1B are top and side views respectively of a wafer showing partially sawn streets separating devices substantially, enlarged for illustration purposes.

FIG. 2 is a schematic top view of a vacuum fixture according to a first embodiment of the present invention.

FIG. 2A is a sectional view of the fixture of FIG. 2 taken along line 2A—2A.

FIG. 3 is a sectional view of a partially sawn wafer held against the vacuum fixture of FIG. 2 prior to grinding the back side of the wafer.

FIG. 4 is a sectional view of a partially sawn wafer held against the vacuum fixture of FIG. 2 after grinding the back side of the wafer.

DETAILED DESCRIPTION OF THE PREFERRED EMBODIMENTS

Figure 5:
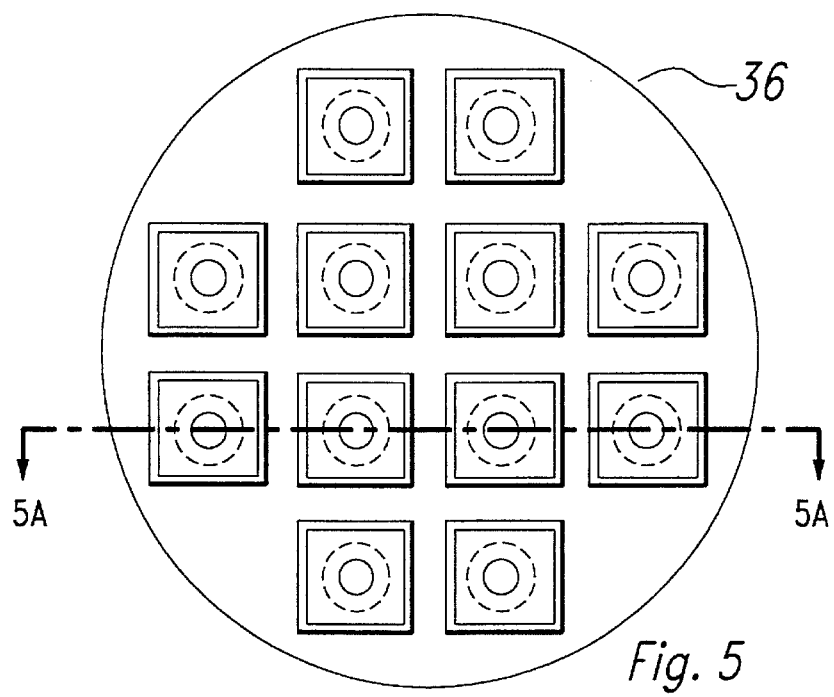
FIG. 5 is a schematic top view of a vacuum fixture according to a second embodiment of the present invention.
Figure 5A:
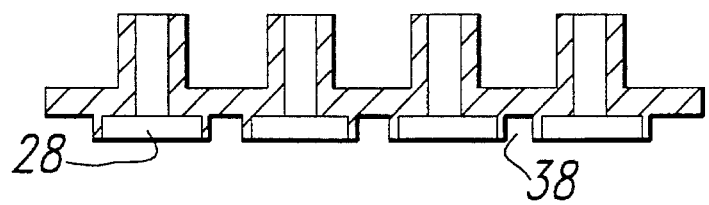
FIG. 5A is a sectional view of the fixture of FIG. 5 taken alone line 5A—5A.

FIGS. 1A and 1B show a silicon wafer 22 on which micromechanical devices, such as digital micromirrors are fabricated. However, it should be understood that this invention is applicable to other substrates and devices. Saw kerfs 24 are made on wafer 22 along scribe marks or streets between the individual devices prior to undercutting the mirrors on the devices. Although the devices shown in FIGS. 1A and 1B are substantially enlarged for illustration purposes such that each figure only shows four rows of devices, each wafer would typically have a substantially larger number of rows. When other micromechanical devices, such as accelerometers or motors, are being fabricated, the partial saw kerfs 24 should be made prior to any fabrication step that makes the devices too fragile to survive cleaning the dicing debris from the device. After the dicing debris has been washed off, the mirrors are undercut. After the undercutting is completed, the mirrors are fragile and cannot be exposed to many manufacturing processes. Fabrication of the devices, including removal of the sacrificial layer and testing may be completed in wafer form.

FIG. 2 shows a vacuum fixture 26 according to one embodiment of the present invention. The fixture 26 may be stainless steel, ceramic, quartz, or any other material capable of being machined or formed to the necessary tolerances. The fixture 26 is machined to have a plurality of headspaces such as headspace 28 above the devices on the wafer, for example, if micromirror devices are being manufactured the headspace 28 above the mirrors will help prevent contact with the mirrors. The headspaces 28 above each device are connected to a plurality of vacuum ports 30 to allow the headspaces 28 to be evacuated. The fixture 26 includes separating members 29A, 29B, 29C, 29D and 29E suitably machined and located to cover the saw kerfs cut into the wafer and to seal around each device.

When all process steps necessary to complete the devices on the wafer have been completed, the partially sawn wafer 22 is fitted to a vacuum fixture 26 as shown in FIG. 3.

Headspaces 28 are then evacuated through vacuum ports 30 and the backside of the wafer 22 is ground down to the partial saw kerfs in order to separate the devices. The operation of grinding the backside of the wafer also provides better thermal management on the completed device. An alternative technique to grinding the backside of the wafer would be to saw the wafers from the backside through to the saw kerfs 24 on the front side. Another alternative would be to use a tool designed to break the wafers. For certain of these alternative techniques, the fixture 26 may need to be flexible to allow some of the wafer breaking equipment to operate.

FIG. 4 shows the completed devices after the devices on the wafer have been separated. Each device is held by the vacuum against the fixture 26 such that the combination of the devices and fixture 26 may be washed to remove any debris from the separation operation. After washing, the vacuum holding the devices to the fixture 26 is removed to allow the device 32 to be removed from the fixture 26. The completed devices are then ready for packaging and any processing further necessary.

Figure 6:
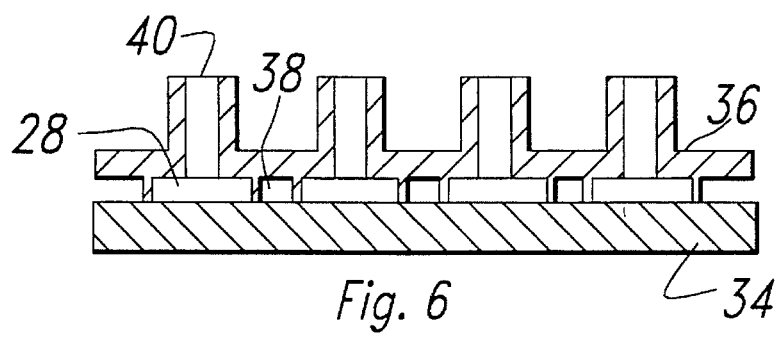
FIG. 6 is a sectional view of a wafer held against the vacuum fixture of the embodiment of FIG. 5 prior to the saw operation.

An alternate embodiment of the process of this invention does not require the scribe marks or streets to be partially sawn before completion of the devices. According to the alternate embodiment, shown in FIG. 5, the fixture 36 has a plurality of machined passages 38 designed to align with the scribe streets of the wafer. Then, as shown in FIG. 6, after the wafer 34 is completely fabricated and all wafer level processing steps, including testing, are completed, wafer 34 is mounted to fixture 36 by drawing a vacuum on the headspace through vacuum ports 40.

Figure 7:
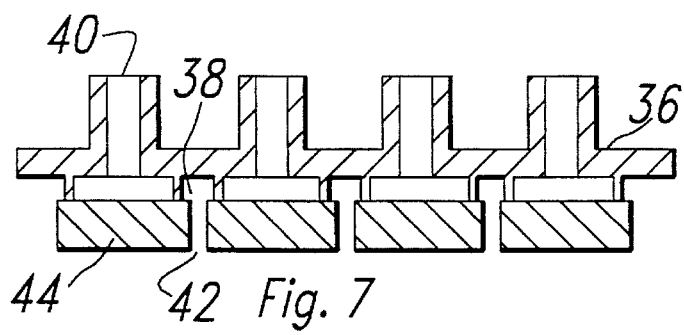
FIG. 7 is a sectional view of a wafer held against the vacuum fixture of the embodiment of FIG. 5 after the saw operation.

The devices on wafer 34 are separated by a backside sawing operation. As shown in FIG. 7, each saw kerf 42 is aligned with a passage 38. As in the prior embodiment the wafer and fixture can now be washed to remove any dicing debris created by the sawing operation. The vacuum is then removed allowing the plurality of completed devices 44 to be removed from the fixture 36.

Thus, although there has been described to this point a particular embodiment for a method of micromechanical device fabrication in which fragile micromechanical structures are protected from debris during dicing, it is not intended that such specific references be considered as limitations upon the scope of this invention except in-so-far as set forth in the following claims. Furthermore, having described the invention in connection with certain specific embodiments thereof, it is to be understood that further modifications may now suggest themselves to those skilled in the art, it is intended to cover all such modifications as fall within the scope of the appended claims.

What is claimed is:

1. A method of processing a wafer containing one or more micromechanical devices, said method comprising:

partially sawing between said devices on a first side;

placing a protective fixture over and in contact with said first side of said wafer, said protective fixture defining a headspace above each device;

evacuating said headspace to create a vacuum;

grinding the side of said wafer opposite said first side to separate said devices; and removing said vacuum to release said devices from said fixture.

2. The method of claim 1 wherein said protective fixture is fabricated of a material selected from the group consisting of stainless steel, ceramic, and quartz.

3. The method of claim 1 wherein said protective fixture is a flexible protective fixture.

4. The method of claim 1 further comprising the step of cleaning debris created by said grinding step from said devices and said protective fixture.

5. The method of claim 1 further comprising the step of cleaning debris created by said further processing step from said devices and said protective fixture.

6. A method of processing a wafer containing one or more micromechanical devices, said method comprising:

placing a flexible protective fixture over and in contact with said wafer, said protective fixture defining a headspace above each device;

evacuating said headspace to create a vacuum;

breaking said wafer to separate said devices; and removing said vacuum to release said devices from said fixture.

7. A method of processing a wafer containing one or more micromechanical devices, said method comprising:

placing a protective fixture over and in contact with a first side of said wafer, said protective fixture defining a headspace above each device;

evacuating said headspace to create a vacuum;

grinding the side of said wafer opposite said first side to separate said devices; and removing said vacuum to release said devices from said fixture.

8. The method of claim 7 wherein said protective fixture is fabricated of a material selected from the group consisting of stainless steel, ceramic, and quartz.

9. The method of claim 7 wherein said protective fixture is a flexible protective fixture.

10. The method of claim 7 further comprising the step of cleaning debris created by said grinding step from said devices and said protective fixture.

* * * * *